(12) United States Patent
Chin et al.

(10) Patent No.: US 11,302,546 B2
(45) Date of Patent: Apr. 12, 2022

(54) SEMICONDUCTOR PROCESS SYSTEM AND METHOD

(71) Applicant: TAIWAN SEMICONDUCTOR MANUFACTURING CO., LTD., Hsinchu (TW)

(72) Inventors: Shih-Ming Chin, Nantou County (TW); Hsiao-Chi Huang, Taichung (TW); Han-Ming Liang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 128 days.

(21) Appl. No.: 16/517,442

(22) Filed: Jul. 19, 2019

(65) Prior Publication Data

US 2020/0035528 A1    Jan. 30, 2020

Related U.S. Application Data

(60) Provisional application No. 62/712,198, filed on Jul. 30, 2018.

(51) Int. Cl.
*G06K 7/14* (2006.01)
*H01L 21/67* (2006.01)
*G06K 7/10* (2006.01)
*H01L 21/308* (2006.01)

(52) U.S. Cl.
CPC .... *H01L 21/67294* (2013.01); *G06K 7/10138* (2013.01); *G06K 7/1447* (2013.01); *H01L 21/3083* (2013.01); *H01L 21/67253* (2013.01)

(58) Field of Classification Search
CPC ........... H01L 21/67294; H01L 21/3083; H01L 21/67253; G06K 7/10138; G06K 7/1447
See application file for complete search history.

(56) References Cited

U.S. PATENT DOCUMENTS

| | | | | |
|---|---|---|---|---|
| 6,327,022 B1* | 12/2001 | Nishi | ................... | G03F 7/2022 355/53 |
| 2006/0214794 A1* | 9/2006 | Wang | ................... | H01L 23/544 340/572.1 |
| 2006/0289645 A1* | 12/2006 | Schuessler | ........... | G06K 7/0004 235/451 |
| 2008/0110994 A1* | 5/2008 | Knowles | ............ | G06K 7/10544 235/462.42 |
| 2012/0269728 A1* | 10/2012 | Jen | ......................... | A61B 5/065 424/9.1 |
| 2013/0337370 A1* | 12/2013 | Lee | ........................... | G03F 1/38 430/5 |

FOREIGN PATENT DOCUMENTS

| | | |
|---|---|---|
| CN | 1424627 A | 6/2003 |
| JP | 2009-134101 A | 6/2009 |

* cited by examiner

*Primary Examiner* — Mohammad M Choudhry
(74) *Attorney, Agent, or Firm* — Maschoff Brennan

(57) ABSTRACT

A system includes a plurality of masks and a scanner device. A pattern of a semiconductor device is defined by each of the plurality of masks in a photolithography process. A first mask of the plurality of masks includes a first identification code configured to distinguish the first mask from remaining masks of the plurality of masks. The scanner device is configured to read the first identification code to select the first mask from the plurality of mask, in order to form the pattern of the semiconductor device on a substrate according to the first mask.

20 Claims, 6 Drawing Sheets

SEMICONDUCTOR PROCESS SYSTEM AND METHOD

CROSS-REFERENCE TO RELATED APPLICATION

The present application claims priority to U.S. Provisional Application Ser. No. 62/712,198, filed Jul. 30, 2018, which is herein incorporated by reference.

BACKGROUND

A photolithograph processes is performed to transfer a pattern on a mask to a semiconductor device. In mass production of the semiconductor devices, a plurality of masks having the same pattern may be employed, in order to increase the efficiency of production. If the plurality of masks having the same pattern are employed and a defective mask of these masks causes a defect pattern, the defective mask is not able to be found efficiently since these masks are having the same patterns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
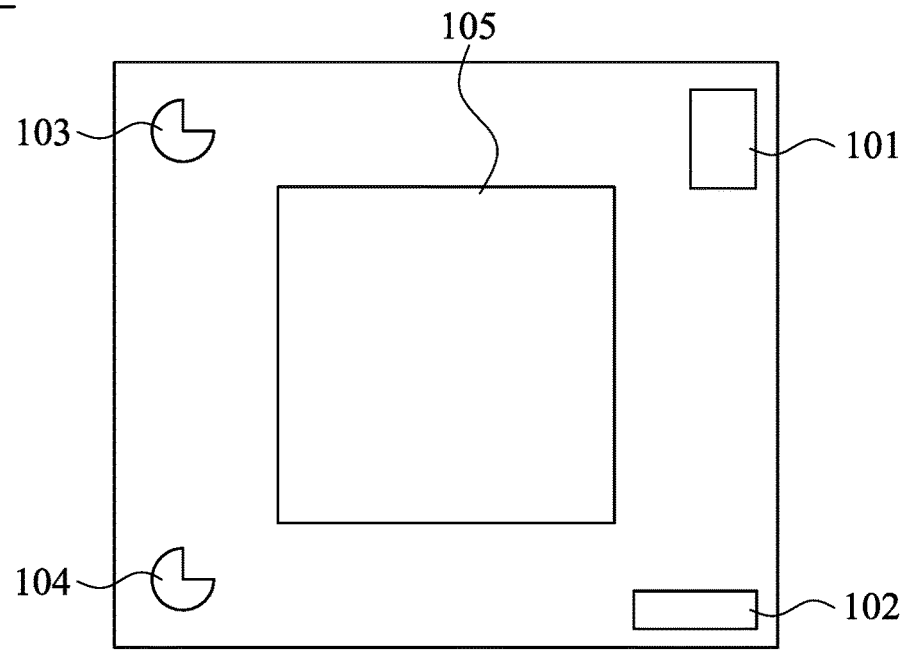
FIG. 1 is a schematic top view diagram of a mask, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Reference is now made to FIG. 1. FIG. 1 is a schematic top view diagram of a mask 100, according to some embodiments of the present disclosure. In some embodiments, the mask 100 is employed, in a semiconductor manufacturing process, to form a pattern of a circuit or a device. In some embodiments, the mask 100 is referred to as a photomask. In some other embodiments, the mask 100 is referred to as a reticle.

The mask 100 includes a first identification code 101, a second identification code 102, a first align mark 103, a second align mark 104, and a pattern 105. In some embodiments, the pattern 105 is configured to be transformed on substrates during the semiconductor manufacturing process (e.g., lithographic process), in order to form a geometric structure of a device in an integrated circuit (IC).

In some non-limiting scenarios where the IC(s) are mass-produced, two or more masks 100 having the same pattern 105 and a plurality of masks having other patterns (hereinafter referred to as "second masks") are employed to fabricate the ICs. The second masks are employed to form other structure of the device or to form other devices in the IC. In some embodiments, the first identification code 101 is configured to distinguish a specific mask from the masks 100. In the semiconductor manufacturing process, the masks 100 may be affected by various factors including process variation, contamination, electrostatic discharge, etc., resulting in different defective patterns 105 on the masks 100. Thus, in practical applications, even the masks 100 are configured to have the same pattern 105, the patterns 105 of the masks 100 may be different from each other due to the factors discussed above. With the first identification code 101, one specific mask is able to be distinguished from the masks 100. For example, the first identification code 101 is able to be read by a scanner device 210 shown in FIG. 2 below, in order to select the specific mask from the masks 100. The first identification code 101 on each mask 100 indicates a unique identity of each mask 100. In other words, the first identification codes 101 on the masks 100 are different. In some embodiments, the first identification code 101 on each mask 100 is unique, and is independent from other first identification codes on the masks 100.

In some embodiments, the first identification code 101 is implemented in a form of image. In some embodiments, the first identification code 101 is implemented in a form of symbols. In some embodiments, the first identification code 101 is an image combined with symbols. For example, the first identification code is Arabic numerals, English alphabet, mathematical symbols, or a combination thereof.

In some embodiments, the second identification code 102 is configured to distinguish patterns 105 of the masks 100 from patterns of the second masks. The second identification code 102 indicates a unique identity of the pattern 105. As described above, the masks 100 are configured to have the same pattern 105. Under this condition, the second identification codes 102 on each mask 100 are the same. If a mask (e.g., second masks discussed above) is configured to have a pattern different from the pattern 105, the second identification code 102 on this mask is different from the second identification code 102 on the masks 100. Accordingly, with the second identification code 102, a specific pattern on the masks is able to be identified. For example, the second identification code 102 of the mask 100 is able to be read by the scanner device 210 shown in FIG. 2, in order to acquire that a pattern expected to be formed on a substrate through the mask 100 is the pattern 105.

In some embodiments, the second identification code 102 is a barcode. The barcode is configured to provide information about the pattern 105. In some embodiments, the second identification code 102 is configured to provide part of information of the first identification code 101. For example, a serial number of "AA123B" is for indicating that a pattern on any mask is the pattern 105. Under this condition, information provided from the second identification code 102 on a specific mask 100 includes the serial number of "AA123B." Correspondingly, information provided from the first identification code 101 on this specific mask 100 includes a serial number of "AA123B-2." Accordingly, by reading the first identification code 101, the specific mask 100 is able to be identified as one mask that has the pattern 105 corresponding to the serial number of "AA123B."

The implementations of the second identification code 102 are given for illustrative purposes. Various types of the second identification code 102 are within the contemplated scope of the present disclosure.

In some embodiments, the first align mark 103 and the second align mark 104 are configured to be aligned by at least one manufacturing tool, in order to transfer the pattern 105 onto a wafer. During the semiconductor processes, the first align mark 103 and the second align mark 104 are aligned to improve the quality of the semiconductor processes. For example, the first align mark 103 and the second align mark 104 are aligned in a photolithograph process to improve the accuracy of alignment. The amount and the shape of the first align mark 103 and the second align mark 104 shown in FIG. 1 are given for the illustrative proposes. Various amounts and the shapes of the first align mark 103 and the second align mark 104 are within the contemplated scope of the present disclosure.

In some embodiments, the first identification code 101, the second identification code 102, the first align mark 103, and the second align mark 104, as discussed above, are located adjacent to the pattern 105. For example, the pattern 105 is substantially disposed at the center of the mask 100. In non-limiting examples, the first identification code 101 is disposed at an upper right corner with respect to the mask 100. The second identification code 102 is disposed at a lower right corner with respect to the mask 100. The first align mark 103 is disposed at an upper left corner with respect to the mask 100. The second align mark 104 is disposed at a lower left corner with respect to the mask 100.

The locations of the first identification code 101, the second identification code 102, the first align mark 103, the second align mark 104, and the pattern 105 in FIG. 1 are given for the illustrative proposes. Various locations of the first identification code 101, the second identification code 102, the first align mark 103, the second align mark 104, and the pattern 105 are within the contemplated scope of the present disclosure. For example, the first align mark 103 and the second align mark 104 are disposed at the opposite sides of the mask 100.

Figure 2:
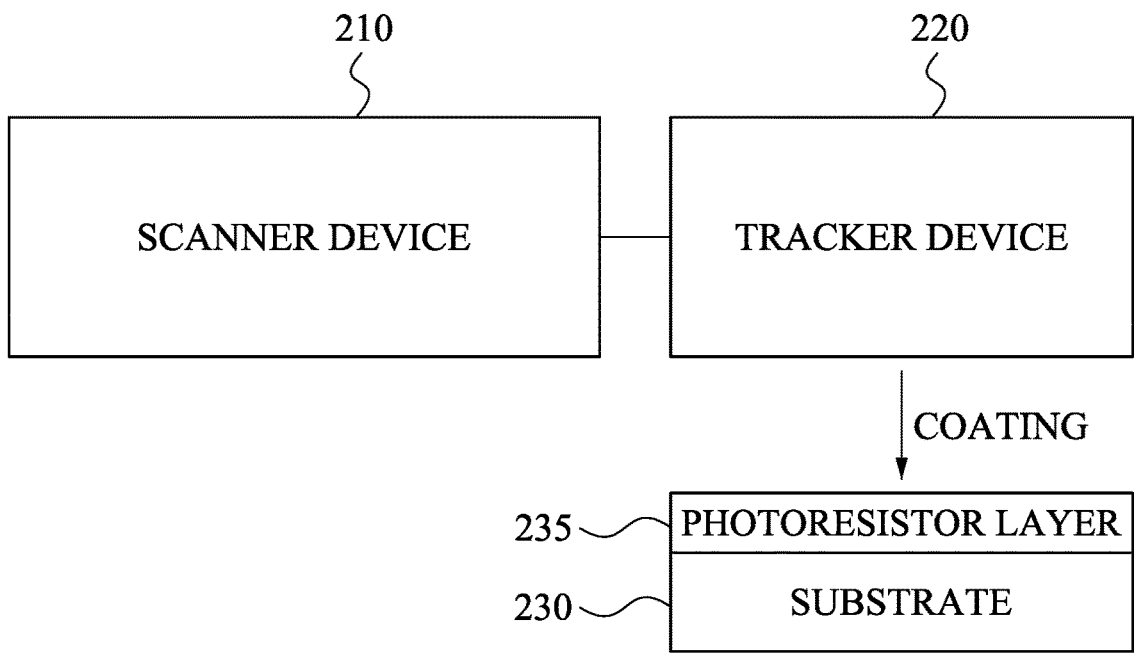
FIG. 2 is a schematic diagram of a semiconductor process system, according to some embodiments of the present disclosure.

Reference is now made to FIG. 2. FIG. 2 is a schematic diagram of a semiconductor process system 200, according to some embodiments of the present disclosure. In some embodiments, the semiconductor process system 200 is employed to form various semiconductor devices with the mask 100 in FIG. 1. In some embodiments, the semiconductor process system 200 is configured to perform a photolithography process, for example, an extreme ultraviolet (EUV) exposure process.

The semiconductor process system 200 includes a scanner device 210 and a tracker device 220. For illustration in FIG. 2, the scanner device 210 is coupled to the tracker device 220. The scanner device 210 cooperates with the tracker device 220 to perform the photolithography process.

In some embodiments, the scanner device 210 is configured to scan the first identification code 101 in FIG. 1, in order to select a specific mask from the masks 100 to perform the photolithography process. In some embodiments, the scanner device 210 is configured to scan the second identification code 101 in FIG. 1, in order to distinguish the mask 100 from the second masks. Detailed operations of the scan device 210 are given with reference to FIGS. 4-6.

In some embodiments, the tracker device 220 is configured to hold a substrate 230 to perform the photolithography process. Alternatively stated, the tracker device 220 is configured to transport the substrate 230 to a proper position to be processed by a corresponding process. In some embodiments, the substrate 230 is a silicon (Si) wafer.

In some embodiments, the tracker device 220 is further configured to coat a photoresistor layer 235 on the substrate 230 after the substrate 230 is transported. For example, the tracker device 220 performs a spin coating process on the substrate 230. The spin coating process will be described in detail with reference of FIGS. 3A-3D shown below.

In some embodiments, the tracker device 220 is further configured to perform a development process to the substrate 230 with the photoresistor layer 235. For example, the tracker device 220 develops the photoresistor layer 235 on the substrate 230 after the photoresistor layer 235 has been patterned by an exposure process. In some embodiments, the tracker device 220 is configured to remove a part of the photoresistor layer 235, in order to form a pattern on the substrate 230. In some other embodiments, the tracker device 220 is configured to dissolve the photoresistor layer 235 by a developer to form a pattern on the substrate 230.

Reference is now made to FIGS. 3A-3D. FIGS. 3A-3D are schematic diagrams illustrating operations of a spin coating process performed by the semiconductor process system 200 in FIG. 2, according to some embodiments of the present disclosure. For ease of understanding, like elements in FIGS. 3A-3D are designated with the same reference numbers with respect to FIG. 2.

In some embodiments, the tracker device 220 in FIG. 2 includes a dispenser 221 and a holder 222. The dispenser 221 is configured to dispense the photoresistor to the substrate 230 to form the photoresistor layer 235. The holder 222 is configured to hold the substrate 230 in order to be processed. In some embodiments, the holder 222 is configured to vacuum the substrate 230, in order to prevent the substrate 230 from tilting and moving around.

Figure 3A:
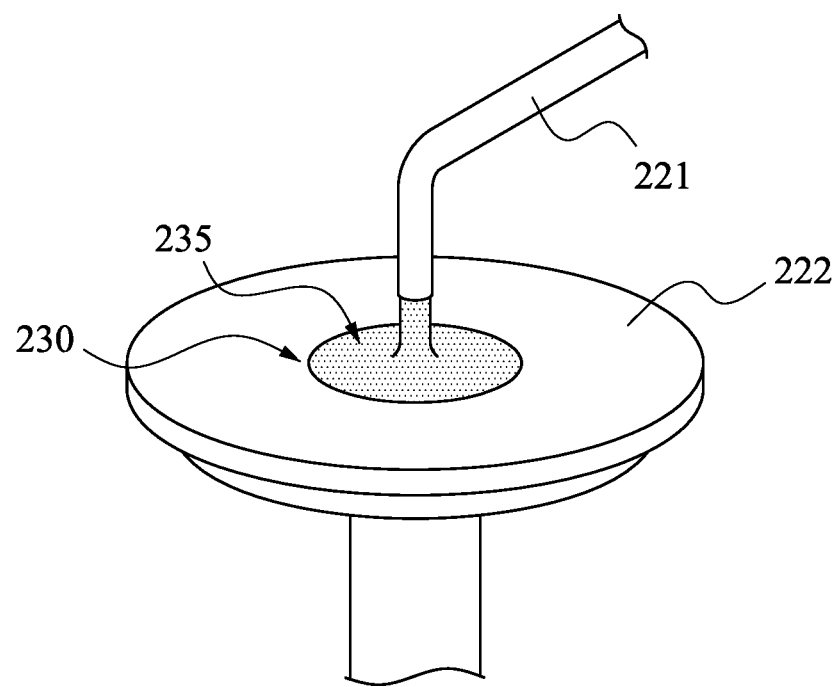
FIGS. 3A-3D are schematic diagrams of a spin coating process performed by the semiconductor process system in FIG. 2, according to some embodiments of the present disclosure.

For illustration in FIG. 3A, the holder 222 vacuums the substrate 230 to fix the substrate 230 on the holder 222. The dispenser 221 dispenses the photoresistor on the center of the substrate 230. The photoresistor is disposed substantially around the center of the substrate 230.

Figure 3B:
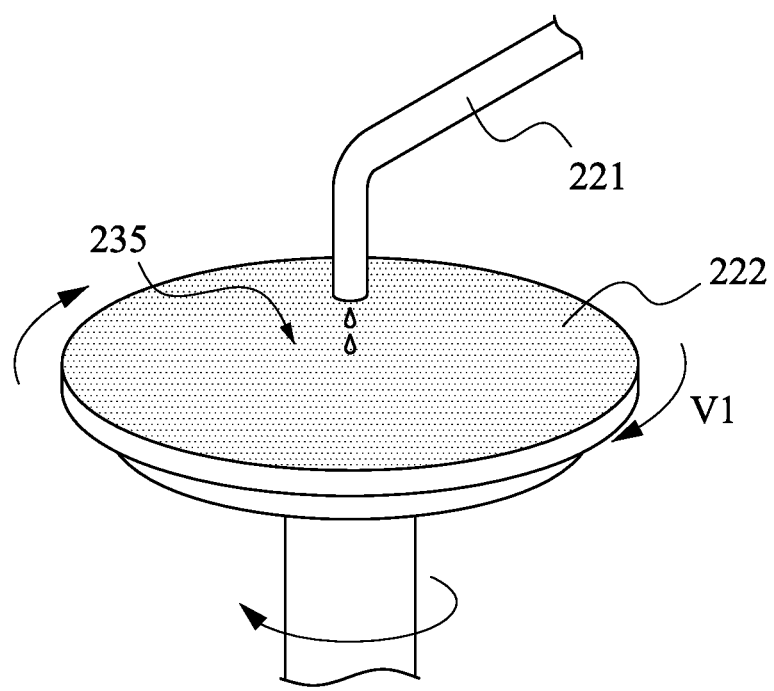

For illustration in FIG. 3B, the holder 222 spreads the photoresistor among the surface of the substrate 230. In some embodiments, the holder 222 is configured to spin at a first speed V1, in order to coat the photoresistor among the surface of the substrate 230. Alternatively stated, the holder 222 rotates at the first speed V1 with the vacuumed substrate 230, and the photoresistor is spread on the surface of the substrate 230 due to the centripetal force generated from the rotation. In some embodiments, when the holder 222 is rotating at the first speed V1, the dispenser 221 still dispenses the photoresistor with a fixed flux. In some other embodiments, when the holder is rotating at the first speed V1, the dispenser 221 dispenses the photoresistor with a reduced flux.

Figure 3C:
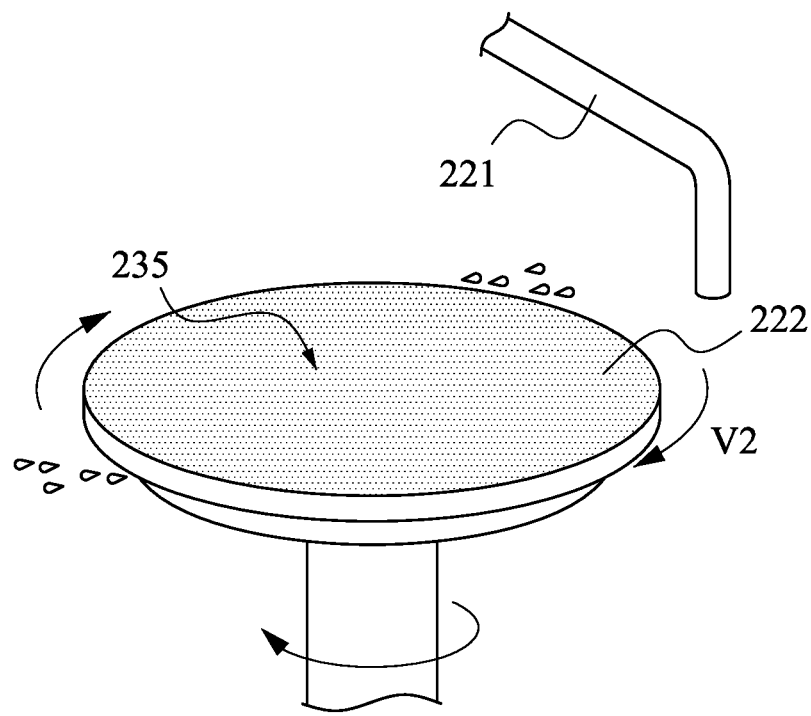

For illustration in FIG. 3C, the holder 222 is configured to spin at a second speed V2 to coat the photoresistor on the substrate 230. In some embodiments, the holder 222 rotates at the second speed V2 with the vacuumed substrate 230, such that the photoresistor is spread to reach an edge of the surface of the substrate 230. In some embodiments, the holder 222 is configured to remove the excess photoresistor on the substrate 230, and the excess photoresistor is removed from the edge of the surface of the substrate 230. In some embodiments, when the folder 222 is rotating at the second speed V2, the dispenser 221 stops dispensing the photoresistor, and the dispenser 221 is moved away from the center of the substrate 230. In some embodiments, the second speed V2 is faster than the first speed V1.

Figure 3D:
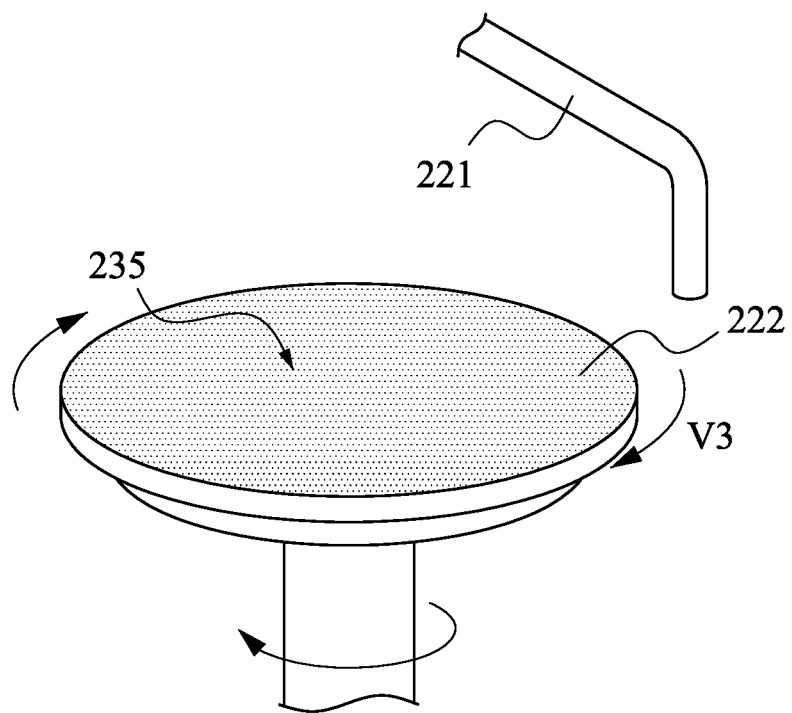

For illustration FIG. 3D, the holder 222 is configured to spin at a third speed V3, in order to further spread the photoresistor on the substrate 230. In some embodiments, the holder 222 is configured to substantially and evenly coat the photoresistor on the substrate 230, in order to form the photoresistor layer 235 in FIG. 2. In some embodiments, the photoresistor layer 235 is substantially even among the surface of the substrate 230. In some other embodiments, the photoresistor layer 235 is thicker at the center of the substrate 230, and is thinner at the edge of the substrate 230. Alternatively stated, the thickness of the photoresistor layer 235 gradually decreases from the center of the substrate 230 to the edge of the substrate 230. In some embodiments, the third speed V3 is equal to the second speed V2. In some further embodiments, the third speed V3 is faster than the second sped V2. In some alternative embodiments, the third speed V3 is slower than the second speed V2, and is faster than the first speed V1.

In FIGS. 3B-3D, the spin direction is illustrated as clockwise direction. The spin direction shown in FIGS. 3B-3D is given for the illustrative purposes. Various spin directions are within the contemplated scope of the present disclosure. For example, the holder 222 is rotated in counterclockwise direction.

The above photoresistor, the first speed V1, the second speed V2, and the third speed V3 shown in FIGS. 3A-3D are only given for the illustrative proposes. Various photoresistors and various values of the first speed V1, the second speed V2, and the third speed V3 are within the contemplated scope of the present disclosure.

Figure 4:
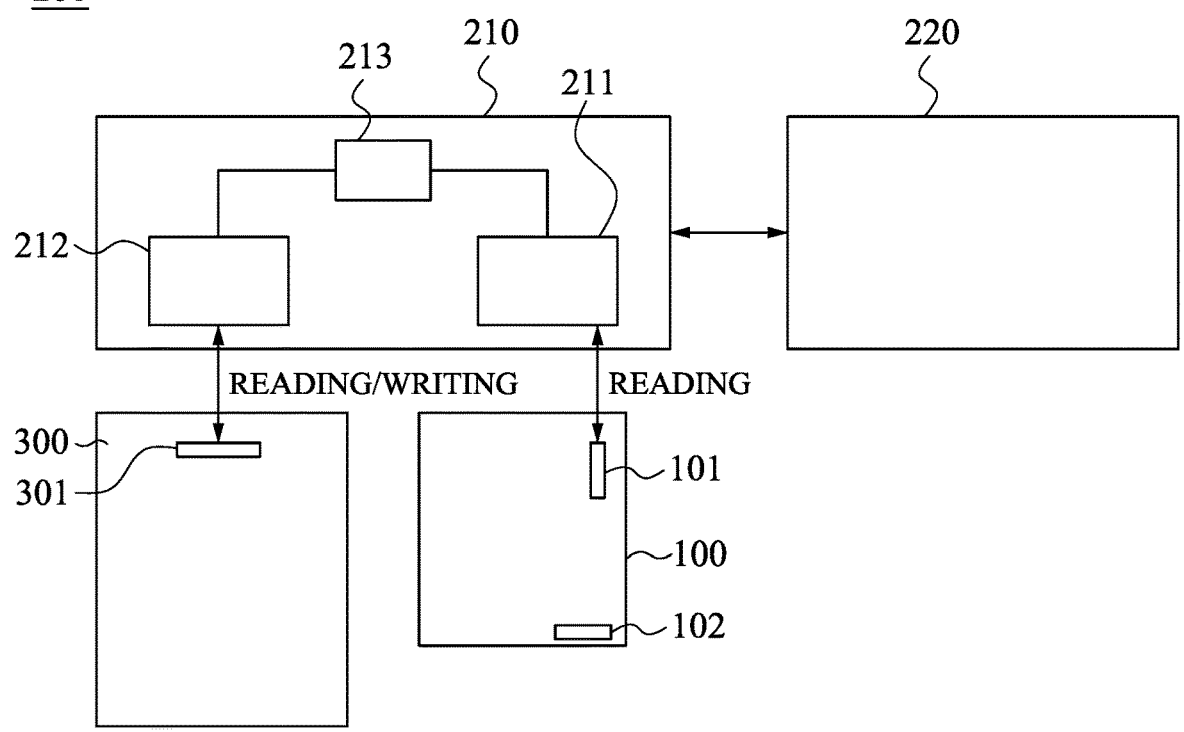
FIG. 4 is a schematic diagram of the semiconductor process system in FIG. 2, according to some other embodiments of the present disclosure.

Reference is now made to FIG. 4. FIG. 4 is a schematic diagram of the semiconductor process system 200 in FIG. 2, according to some embodiments of the present disclosure. For ease of understanding, like elements in FIG. 4 are designated with the same reference numbers with respect to FIG. 1 and FIG. 2.

In some embodiments, the semiconductor process system 200 further includes at least one mask container 300. The at least one mask container 300 is configured to store the mask 100. In some embodiments where a plurality of masks 100 are employed, a plurality of mask containers 300 are employed to store the plurality of masks 100. In some embodiments, the scanner device 210 is configured to read the first identification codes 101, in order to select a predetermined mask from the masks.

In some embodiments, the mask container 300 includes a third identification code 301. In some embodiments, the third identification code 301 indicates an identity of a mask stored in the masker container 300. In some embodiments, the third identification code 301 is configured to indicate that a stored mask in the mask container 300 is expected to be the mask 100. In some embodiments, the third identification code 301 is a radio frequency identification (RFID) tag.

In some embodiments, the scanner device 210 includes an image recognizer 211, an RFID reader 212, and a database 213. For illustration in FIG. 4, the image recognizer 211 is coupled to the database 213. The RFID reader 212 is coupled to the database 213.

In some embodiments, the image recognizer 211 is configured to read the first identification code 101 on the mask 100. In some further embodiments, the image recognizer 211 is configured to read the first identification codes 101 on the plurality of masks 100, in order to select a specific mask 100 from the plurality of masks 100. With the selected specific mask 100, the pattern 105 is able to be formed on the substrate 230. Alternatively stated, the scanner device 210 is able to read, by the image recognizer 211, the first identification codes 101 to select the specific mask 100 to perform the semiconductor processes.

In some embodiments, the RFID reader 212 is configured to read the third identification code 301 on the mask container 300. In some further embodiments, the RFID reader 212 is configured to read the third identification codes to select a specific mask container 300 from the plurality of mask containers 300, in order to acquire the mask 100. In some embodiments, the mask 100 is acquired to perform the semiconductor processes. Alternatively stated, the scanner device 210 is able to read, by the RFID reader 212, the third identification codes 301 from the plurality of mask containers 300 to select the mask container 300 from the plurality of mask containers 300 to perform the semiconductor processes, in which the mask 100 is considered to be stored in the mask container 300. For example, the scanner device 210 acquires the mask 100 from the selected mask container 300 to perform the exposure process.

In some further embodiments, the database 213 is configured to store information regarding the first identification code 101 of each mask 100 and the third identification code 301 of each mask container 300. In some embodiments, the plurality of masks 100 correspond to the plurality of mask containers 300 respectively. For example, if a specific mask 100 is expected to be stored in a specific mask container 300, the first identification code 101 of the specific mask 100 is configured to correspond to the third identification code 301 of the specific mask container 300. Under this condition, the first identification code 101 and its corresponding third identification code 301 may be referred to as an "identification code pair." In some embodiments, information regarding identification code pairs for the plurality of masks 100 and the plurality of mask containers 300 are stored in the database 213.

In some embodiments, the scanner device 210 is configured to compare the first identification code 101 read by the image recognizer 211 with the third identification code 301 read by the RFID reader 212. For example, if information provided from the first identification code 101 and information provided from the third identification code 301 are designed with the same syntax, the scanner device 210 may directly compare the first identification code 101 with the third identification code 301. If the first identification code 101 matches the third identification code 301, it indicates that the mask container 300 stores the correct mask 100. Under this condition, the mask 100 is retrieved from the mask container 300, in order to perform the subsequent process. Alternatively, if the first identification code 101 does not match the third identification code 301, it indicates that the mask container 300 stores a wrong mask 100, and an additional check is performed to correct this situation.

In some embodiments, if the information provided from the first identification code 101 and the information provided from the third identification code 301 are designed with different syntaxes, the scanner device 210 is configured to determine, based on the information stored in the database 213, whether the third identification code 301 matches to the first identification code 101. For example, the scanner device 210 is further configured to determine whether the first identification coed 101 and the third identification code 301 matches the identification code pairs stored in the database 213, in order to verify whether the first identification code 101 and the third identification code 301 are matched. If these codes match the identification code pairs stored in the database 213, it indicates that the mask container 300 stores the correct mask 100. Alternatively, if these codes do not match the identification code pairs stored in the database 213, it indicates that the mask container 300 stores the wrong mask 100.

In some embodiments, the RFID reader 212 is further configured to write the third identification code 301. The scanner device 210 is able to write, by the RFID reader 212, the third identification code 301 according the first identification code 101 on the mask 100. For example, the scanner device 210 is configured to transform the first identification code 101 on a specific mask 100 into a form of the third identification code 301 of the specific mask container 300, in order to assign the specific mask container to store the specific mask 100. Alternatively stated, the scanner device 210 is configured to transfer the information about the first identification codes 101 into a form which is readable by the RFID reader 212.

For example, the scanner device 210 reads the first identification code 101 on the mask 100, and further transfers the first identification code 101 into the form of the RFID tag. Next, the scanner device 210 writes the information of the RFID tag into the third identification 301. The third identification code 301 thus has the information of the first identification code 101. With the above operations, the mask container 300 is assigned to store the mask 100 having the transferred first identification code 101.

In some embodiments, the scanner device 210 is further configured to read the second identification code 102 on the mask 100. In some embodiments, the scanner device 210 includes a barcode reader (not shown). The barcode reader is configured to read a barcode, for example, the second identification code 102. In some embodiments, when the patterns are different, the scanner device 210 is able to distinguish from the different patterns by reading the second identification code 102 on each mask. In some embodiments, the scanner device 210 is configured to read the first identification 101 and the second identification code 102 simultaneously. In some other embodiments, the scanner device 210 is configured to read the first identification code 101 and the second identification code 102 at different time intervals.

Figure 5:
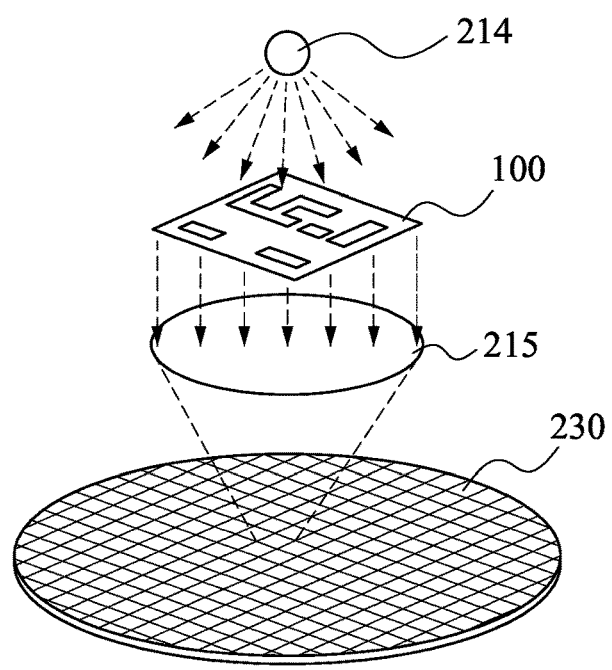
FIG. 5 is a schematic diagram of the semiconductor process performed with the mask in FIG. 1, according to some embodiments of the present disclosure.

Reference is now made to FIG. 5. FIG. 5 is a schematic diagram of illustrating a semiconductor process performed with the mask 100 in FIG. 1, according to some embodiments of the present disclosure. For ease of understanding, like elements in FIG. 5 are designated with the same reference numbers with respect to FIGS. 1 and 2.

In some embodiments, the semiconductor process includes a photolithography process. In some embodiments, the scanner device 210 further includes a light source 214 and an exposure system 215. The scanner device 210 is configured to perform the photolithography process on the substrate 230.

In some embodiments, the light source 214 is configured to generate light, for example, a EUV light, an ultraviolet (UV) light, or a visible light. In some embodiments, the light source 214 is configured to generate a laser. The types of the light generated from the light source above are given for the illustrative proposes. Various types of light, polarizations, coherence, and spectrum ranges are within the contemplated scope of the present disclosure.

In some embodiments, the exposure system 215 is configured to direct the light generated from the light source 214 toward the wafer (e.g., substrate 230). In some embodiments, the exposure system 215 is configured to focus the light on the wafer to expose the photoresistor layer 235.

For illustration in FIG. 5, the scanner device 210 performs the photolithography process on the substrate 230. The light source 214 generates the light toward the mask 100. The light passes through the pattern 105 on mask 100. Equivalently, the light brings the information of the pattern 105 after passing the pattern 105 on the mask 100. The exposure system 215 receives the light passing through the pattern 105 on the mask 100, and directs the light toward the substrate 230. The exposure system 215 focuses the light on a pre-determined position of the substrate 230. As a result, the information of the pattern 105 on the mask 100 travels with the light to the substrate 230. Equivalently, the scanner device 210 transfers the information of the pattern 105 on the mask 100 to the photoresistor layer 235 on the substrate 230. Alternatively stated, the scanner device 210 performs the photolithography process to pattern the photoresistor layer 235. The above configuration of the photolithography process is given for the illustrative proposes. Various configurations of photolithography process are within the contemplated scope of the present disclosure. For example, the mask 100 is a reflective type mask. The light generated by the light source 214 is transmitted to the mask 100 and is reflect to the exposure system 215 or the substrate 230.

Reference is made to FIGS. 2, 3A-3D, 4, and 5, again. In FIGS. 3A-3D, the substrate 230 is processed under the spin coating process to have the photoresistor layer 235 thereon, as shown in FIG. 2. In FIG. 4, the mask container 300 is transported to the semiconductor process system 200, and the third identification code 301 on the mask container 300 is read by the RFID reader 212 of the scanner device 210. The mask container 300 is opened by the semiconductor process system 200 to reach the mask 100 stored in the mask container 300. The first identification code 101 of the mask 100 is read by the image reader 211 of the scanner device 210. After the third identification code 301 and the first identification code 101 are read, the scanner device 210 compares the third identification code 301 with the first identification code 101, in order to determine whether the mask container 300 matches the mask 100 according to the "identification code pair" stored in the database 213. In FIG. 5, if the third identification code 301 and the first identification code 101 are determined to be matched, the photolithography process is performed with the mask 100 to expose the photoresistor layer 235 through the pattern 105 of the mask 100 as illustrated in FIG. 1. The tracker device 220 develops the exposed photoresistor layer 235 in order to form a pattern corresponding to the pattern 105 by etching part of the photoresistor layer 235. The substrate 230 then has a pattern corresponding to the pattern 105 on the mask 100 which has been identified by reading the identification code 101. In some embodiments, the substrate 230 is processed by an implantation process after the part of photoresistor layer 235 is etched. The implantation process is performed to implant a region on the substrate 230 where there is no photoresistor layer 235. In some embodiments, the implanted region is for further defining a region of source or drain structures of a transistor. The region is also referred to as an active region or the oxide definition (OD) region in some embodiments.

Figure 6:
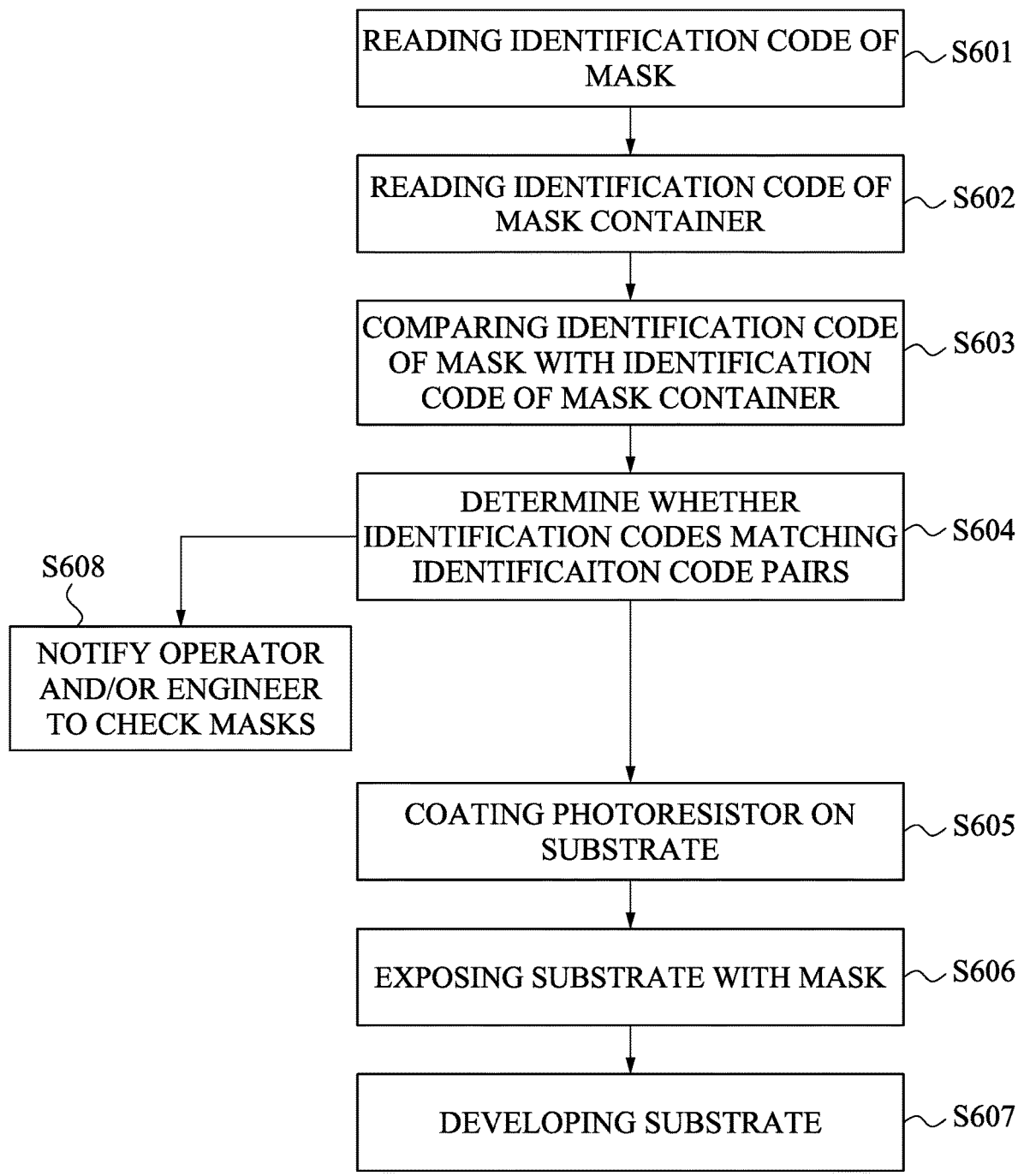
FIG. 6 is a flow chart of a method of the semiconductor process performed by the semiconductor process system in FIGS. 2 and/or 4, according to some embodiments of the present disclosure.
Figure 7:
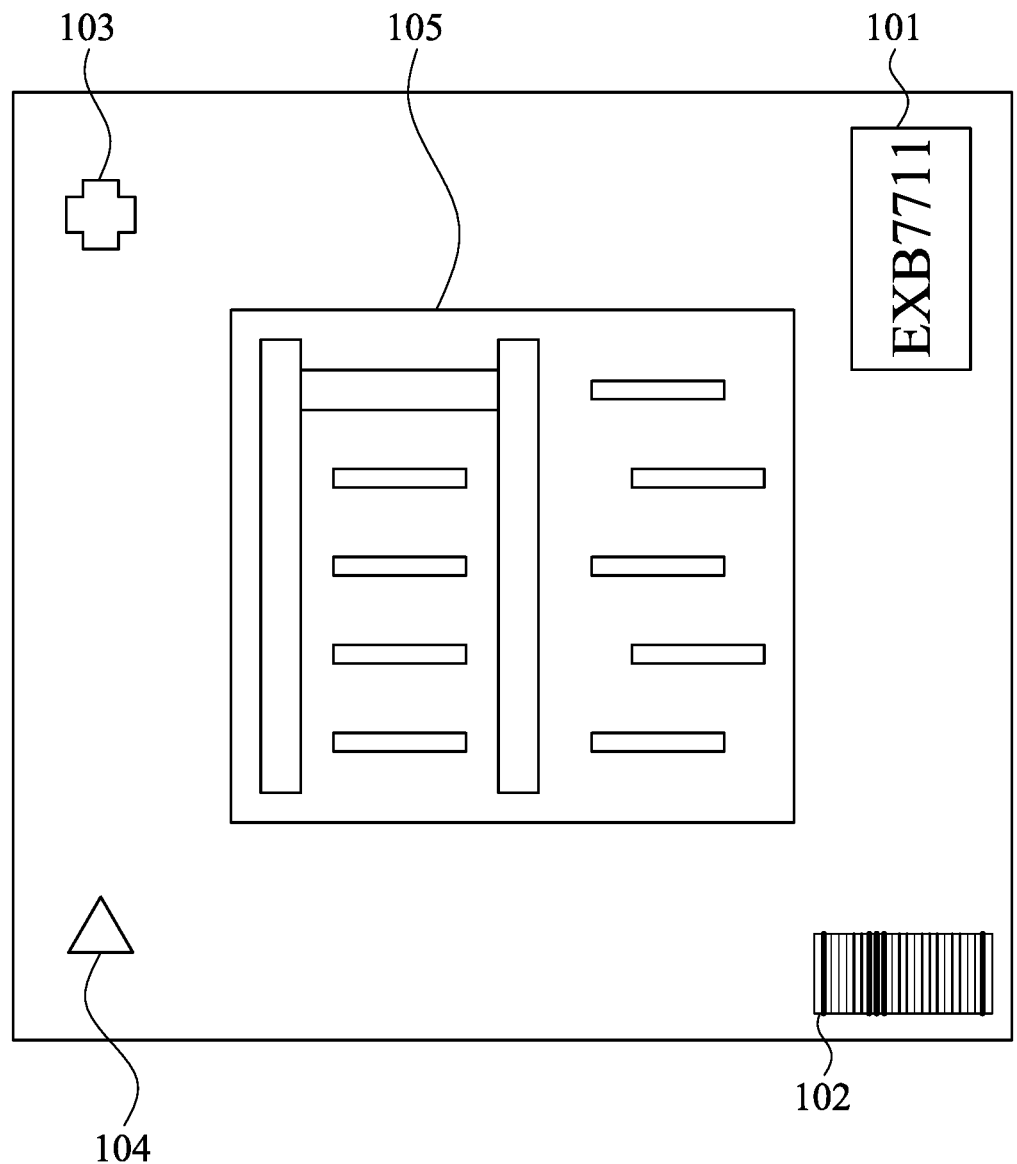
FIG. 7 is a schematic top view diagram of a mask in FIG. 1, according to other embodiments of the present disclosure.

Reference is now made to FIG. 6 and FIG. 7. FIG. 6 is a flow chart of a method 600 of the semiconductor process performed by the semiconductor process system 200 in FIGS. 2 and/or 4 according to some embodiments of the present disclosure. FIG. 7 is a schematic top view diagram of a mask 700 in FIG. 1, according to some embodiments of the present disclosure. For ease of understanding, like elements in FIG. 7 are designated with the same reference numbers with respect to FIG. 1.

As an example, operations of the method 600 are described with reference to the mask 100 shown in FIG. 7. In some embodiments, the first identification code 101 is implemented with symbols. For example, as shown in FIG. 7, the first identification code 101 is "EXB77111." The second identification code 102 is implemented as a barcode. The first align mark 703 is in the form of a cross. The second align mark 704 is in the form of a triangle. The above implementations and shapes are given for illustrative purposes, and the present disclosure is not limited to FIG. 7.

In some embodiments, the method 600 includes operations S601, S602, S603, S604, S605, and S606. In operation S601, with reference to FIG. 2, FIG. 4, and FIG. 7, the image recognizer 211 reads the first identification code 101 on the mask 700 of the masks. For example, the image reader 211 in FIG. 4 reads the first identification code 101 to acquire a corresponding information of "EXB7711," and transmits the information of "EXB7711" to the database 213.

In some embodiments, during operation S601, the scanner device 210 reads the second identification code 102 on the mask 100 and transmits the information contained in the barcode to the database 213.

In operation S602, the RFID reader 212 reads the third identification code 301 on the mask container 300 of the mask containers. The RDIF reader 212 transmits the information of the third identification code 301 to the database 213.

In operation S603, the scanner device 210 compares the information of the first identification code 101 and the third identification code 301 with the identification code pairs stored in the database 213.

If the first identification code 101 and the third identification code 301 are matched, operation S604 is performed. Under this condition, it indicates that a mask stored in the mask container 300 is the specific mask 100.

If the first identification code 101 and the third identification code 301 are not matched, it indicates that the mask container 300 may store a wrong mask 100, or that a wrong mask container 300 is selected in operation S602. In some embodiments, under this condition, a warning message is sent by the semiconductor process system 200 in FIG. 2, in order to notify an operator and/or an engineer to check the masks 100 and/or the mask containers 300.

In some embodiments, during the operation S603, the scanner device 210 writes the information of the first identification code 101 read by the image reader 211 into the third identification code 301. Thus, the identification code 301 carries the information of the first identification code 101. Accordingly, the mask 100 is expected being stored in the mask container 300.

Based on the above operations, the identities of the mask containers and the masks are checked and matched to each other according to the identification code pairs.

In some approaches, as described above, only identification code for indicating a pattern is employed to identify the mask. However, if a plurality of masks are used in mass production, a specific mask is not able to be found or confirmed by reading the identification code for indicating the pattern. As a result, in these approaches, a defective mask may be incorrectly used to perform the semiconductor process.

Compared to the above approaches, with the first identification code 101, the scanner device 210 is able to distinguish the mask 100 from other masks. As a result, a specific mask 100 can be found, in order to prevent from using the defective mask. Moreover, the scanner device 210 is also able to determine whether the mask 100 is expected to be stored in the mask container 300 by reading the third identification code 301. The scanner device 210 is able to write the information of the first identification code 101 to the third identification code 301 on the mask container 300. Therefore, when the scanner device 210 reads the third identification code 301 on the mask container 300, the mask 100 is expected to be stored in the mask container 300, the semiconductor process system 200 has a lower chance using a wrong mask to perform the semiconductor process. Therefore, the quality of the semiconductor process is improved, and the cost of the semiconductor process is decreased.

In operation S604, the tracker device 220 coats the photoresistor on the substrate 230. For example, with reference to FIGS. 2-4, the tracker device 220 performs the spin coating process to the substrate 230. The holder 222 vacuums the substrate 230. After the substrate 230 stands stable on the holder 222, the dispenser 221 dispenses the photoresistor on the center of the substrate 230. Next, the tracker device 220 spreads the photoresistor among the surface of the substrate 230 by spinning the holder 222. In some embodiments, the holder 222 spins at a first speed V1 when the holder 222 begins to spin, and then the holder 222 spins at a second speed V2 which is faster than the first speed V1 after a certain period. The photoresistor layer 235 is formed after the tracker device 220 spreads the photoresistor. In some embodiments, the photoresistor layer 235 is formed to be substantially flat among the surface of the substrate 230.

In operation S605, the scanner device 210 performs the exposure process on the photoresistor layer 235 with the pattern 105 on the mask 700. The light source 214 generates light toward the mask 100. In some embodiments, the light passes through the pattern 105 and is patterned by the pattern 105. The exposure system 215 directs and focuses the light on the photoresistor layer 235 on the substrate 230. Alternatively stated, the photoresistor layer 235 is exposed by the patterned light.

In operation S606, the tracker device 220 performs the development process on the photoresistor layer 235 being exposed. The photoresistor layer 235 is patterned after being developed. Therefore, the pattern 105 on the mask 100 is patterned on the photoresistor layer 235. Alternatively stated, a layout corresponding to the pattern 105 of the mask 100 is developed on the substrate 230. The substrate 230 with the patterned photoresistor layer 235 is proceeded to be processed to a semiconductor device.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, in various embodiments, operations S601-S603 are able to be performed after operation S604. Alternatively, operations S601-S603 and operation S604 are able to be performed simultaneously.

As described above, with the arrangement of the mask 100 provided in embodiments of the present disclosure, a specific mask can be distinguished from other masks. Accordingly, it is able to select the specific mask to perform various semiconductor processes. As a result, the accuracy and the efficiency of semiconductor manufacturing process are improved.

In some embodiments, a system includes a plurality of masks and a scanner device. A pattern of a semiconductor device is defined by each of the plurality of masks in a photolithography process. A first mask of the plurality of masks includes a first identification code configured to distinguish the first mask from remaining masks of the plurality of masks. The scanner device is configured to read the first identification code to select the first mask from the plurality of masks, in order to form the pattern of the semiconductor device on a substrate according to the first mask.

Also disclosed is that a method includes the following operations. An image with at least one symbol on a predetermined photomask is read by a scanner device. A RFIG tag on a mask container is read by the scanner device. The image is compared with the RFID tag by the scanner device in order to verify whether the photomask expected to be stored in the mask container, in order to perform a photolithography process according to the predetermined photomask. The image indicates an independent identity of the predetermined photomask. The RFID tag indicates an independent identity of a photomask expected to be stored in the mask container.

Also disclosed is that a method includes the following operations. A plurality of first identification codes on a plurality of masks are read in order to select a first mask from the plurality of masks. A pattern of a semiconductor device according to the first mask is formed in a photolithography process. The plurality of first identification codes on the plurality of masks are different from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a plurality of masks, wherein a pattern of a semiconductor device is defined by each of the plurality of masks in a photolithography process,
   wherein a first mask of the plurality of masks comprises a first identification code configured to distinguish the first mask from remaining masks of the plurality of masks; and
   a scanner device configured to read the first identification code to select the first mask from the plurality of masks, in order to form the pattern of the semiconductor device on a substrate according to the first mask,
   wherein the first mask and a second mask of the remaining masks comprise second identification codes that are configured to distinguish a first pattern on the first mask from a second pattern on the second mask, and
   when the second identification code of the first mask is the same as the second identification code of the second mask, the first pattern on the first mask is the same as the second pattern on the second mask.

2. The system of claim 1, further comprising:
   a tracker device configured to perform the photolithography process with the first mask, in order to form the pattern on the substrate.

3. The system of claim 1, further comprising:
   a plurality of containers configured to store the plurality of masks,
   wherein a first container of the plurality of the containers comprises a third identification code, and the third identification code is configured to indicate that a stored mask in the first container is expected to be the first mask.

4. The system of claim 3, wherein the scanner device is further configured to read the third identification code, and to determine whether the third identification code matches the first identification code, in order to acquire the first mask from the first container.

5. The system of claim 4, wherein a tracker device is configured to perform the photolithography process according to the first mask when the third identification code matches the first identification code.

6. The system of claim 3, wherein the scanner device comprises:
   an image recognizer configured to read the first identification code;
   a radio frequency identification (RFID) reader configured to read the third identification code; and
   a database configured to store the first identification code read by the image recognizer and the third identification code read by the RFID reader.

7. The system of claim 3, wherein the third identification code is an RFID tag, and the RFID reader is further configured to write the third identification code.

8. The system of claim 3, wherein the first identification code is an image with symbols.

9. A method, comprising:
reading, by a scanner device, an image, wherein the image indicates an independent identity of a predetermined mask;
reading, by the scanner device, a RFID tag on a mask container, wherein the RFID tag indicates an independent identity of a mask expected to be stored in the mask container;
the scanner device selecting the mask container from a plurality of mask containers according to the RFID tag being read, and selecting the predetermined mask from a plurality of masks stored in the mask container being selected according to the image being read; and
comparing, by the scanner device, the image with the RFID tag, in order to verify whether the mask expected to be stored in the mask container is the predetermined mask, in order to perform a photolithography process according to the predetermined mask.

10. The method of claim 9, further comprising:
in response to the mask being the predetermined mask, depositing, by a tracker device, a photoresistor on a substrate in the photolithography process.

11. The method of claim 10, further comprising:
exposing, by the scanner device, the substrate with the predetermined mask in the photolithography process.

12. The method of claim 11, further comprising:
developing, by the tracker device, a layout of the predetermined mask on the substrate.

13. The method of claim 9, further comprising:
writing, by the scanner device, the RFID tag on the mask container according to the image with at least one symbol on the predetermined mask.

14. A method, comprising:
reading a plurality of first identification codes on a plurality of masks, in order to select a first mask from the plurality of masks, wherein the plurality of first identification codes on the plurality of masks are different from each other, wherein the first mask has a second identification code thereon that is configured to provide part of information of the first identification code on the first mask, and to indicate a first pattern;
identifying, by reading the first identification code, the first mask as a mask that has the first pattern corresponding to the second identification code; and
forming a pattern of a semiconductor device according to the first mask in a photolithography process.

15. The method of claim 14, further comprising:
reading a plurality of third identification codes on a plurality of mask containers, in order to select a first mask container from the plurality of mask containers, wherein a mask stored in the first mask container is expected to be the first mask.

16. The method of the claim 15, wherein a first code of the plurality of first identification codes is arranged on the first mask, a second code of the plurality of third identification codes is arranged on the first mask container, and reading the plurality of third identification codes comprises:
determining whether the first code on the first mask matches the second code on the first mask container.

17. The method of claim 15, wherein each of the plurality of third identification codes is an RFID tag.

18. The method of claim 15, wherein a first code of the plurality of first identification codes is arranged on the first mask, a second code of the plurality of third identification codes is arranged on the first mask container, and the method further comprises:
writing the second code on the first mask container according to the first code on the first mask.

19. The method of claim 14, further comprising:
exposing the pattern of the semiconductor device according to the first mask in the photolithography process, in order to develop the pattern.

20. The method of claim 14, wherein the first identification code of the first mask is an image with symbols.

* * * * *